United States Patent
Tkachuk

(10) Patent No.: US 8,890,272 B2
(45) Date of Patent: Nov. 18, 2014

(54) PHOTODETECTOR

(75) Inventor: Michael Tkachuk, Sayville, NY (US)

(73) Assignee: BAH Holdings LLC, Glen Cove, NY (US)

( * ) Notice: Subject to any disclaimer, the term of this patent is extended or adjusted under 35 U.S.C. 154(b) by 468 days.

(21) Appl. No.: 13/207,372

(22) Filed: Aug. 10, 2011

(65) Prior Publication Data
US 2013/0037854 A1 Feb. 14, 2013

(51) Int. Cl.
*H01L 31/102* (2006.01)
*H01L 31/105* (2006.01)

(52) U.S. Cl.
CPC .................. *H01L 31/105* (2013.01)
USPC ..... 257/458; 257/233; 257/656; 257/E25.032

(58) Field of Classification Search
None
See application file for complete search history.

(56) References Cited

U.S. PATENT DOCUMENTS

| | | | | |
|---|---|---|---|---|
| 4,368,385 A | * | 1/1983 | Kanbe et al. | 250/551 |
| 5,202,570 A | * | 4/1993 | Tanaka et al. | 250/575 |
| 2006/0006482 A1 | * | 1/2006 | Rieve et al. | 257/414 |
| 2013/0037854 A1 | * | 2/2013 | Tkachuk | 257/184 |

* cited by examiner

*Primary Examiner* — Tan N Tran
*Assistant Examiner* — Scott R Wilson
(74) *Attorney, Agent, or Firm* — Neal, Gerber & Eisenberg LLP; James P. Muraff

(57) ABSTRACT

A photodetector is provided, comprising: a radiation-absorbing semiconductor region and a collection semiconductor region separated by and each in contact with a barrier semiconductor region; wherein, at least in the absence of an applied bias voltage, the band gap between the valence band energy and the conduction band energy of the barrier semiconductor region is offset from the band gap between the valence band energy and the conduction band energy of the radiation-absorbing semiconductor region so as to form an energy barrier between the radiation-absorbing semiconductor region and the collection semiconductor region which resists the flow of minority carriers from the radiation-absorbing semiconductor region to the collection semiconductor region. Also provided is a method of manufacturing a photodetector.

40 Claims, 2 Drawing Sheets

PHOTODETECTOR

FIELD OF THE INVENTION

The present invention relates to semiconductor photodetectors with improved temperature stability.

BACKGROUND

Photodetectors, i.e. devices which detect light or other electromagnetic energy, are widely used for a variety of applications such as imaging, security systems, gas sensing and others. A photodetector sensitive to infrared light is known as an infrared (IR) photodetector. The most advanced modern semiconductor photodetctors are designed as hetero-structures of different semiconductors. Infrared photodetectors, which work in the range 3-10 microns, are often based on relatively narrow band gap semiconductors such as GaAs, InSb, AlAs and their solid solutions. The highest performing IR photodetectors are currently cooled to a low temperature up to cryogenic in order to decrease the internal detector noise. At ambient or higher temperatures the performance significantly degrades because the dark current of photodetectors based on narrow band gaps increases dramatically as a result of the charge carriers' thermal generation. This temperature-dependent behaviour is a significant limitation, which restrains considerably the application of IR photodetectors in low power, low cost devices where the provision of complex cooling equipment is not practical.

It is a primary object of the invention to provide a semiconductor hetero-structure for electromagnetic energy sensing with improved thermo stability.

SUMMARY OF INVENTION

In accordance with a first aspect of the invention there is provided a photodetector comprising: a radiation-absorbing semiconductor region and a collection semiconductor region separated by and each in contact with a barrier semiconductor region; wherein, at least in the absence of an applied bias voltage, the band gap between the valence band energy and the conduction band energy of the barrier semiconductor region is offset from the band gap between the valence band energy and the conduction band energy of the radiation-absorbing semiconductor region so as to form an energy barrier between the radiation-absorbing semiconductor region and the collection semiconductor region which resists the flow of minority carriers from the radiation-absorbing semiconductor region to the collection semiconductor region.

Here, the "radiation-absorbing region" is where the majority of photons impinging on the photodetector will be absorbed by the device and generate carriers, and hence can be identified based on knowledge of the thickness of each region and the radiation absorption coefficient of the material. Upon generation, the carriers diffuse towards the "collection region" thereby generating a photocurrent. In such photodetectors there is also an internal electric field present in the barrier layer due to the band energy difference between the radiation-absorbing and collection regions, and this electric field further assists in the movement of carriers and the creation of a photocurrent.

However, as will be described in more detail below, the energy barrier between the radiation-absorbing semiconductor region and the collection semiconductor region according to the first aspect of the invention (the "minority carrier barrier") provides resistance to the flow of minority carriers from the radiation-absorbing semiconductor region to the collection semiconductor region. As such, the minority carrier barrier compensates, at least partially, for the intrinsic change in photodetector responsivity with temperature. If, for example, the working temperature decreases, then the intrinsic photo response of the structure quickly increases because the lifetime of carriers increases (due to a reduced rate of carrier recombination). However, the resistance to the flow of these carriers due to the energy barrier also effectively increases (since at low temperatures fewer carriers will have sufficient energy to cross the energy barrier), which compensates for the change in photo response. The reverse is true for the case where the working temperature increases. As such, the photodetector need not be cooled or otherwise temperature-stabilised during operation.

The magnitude of the energy barrier is selected to provide a sufficient level of resistance to dark current whilst not inhibiting the generation of a photocurrent during use (since a significant energy barrier would block photocurrent and therefore decrease photo response). Ideally, the magnitude of the energy barrier between the radiation-absorbing semiconductor region and the collection semiconductor region is selected dependent on the working temperature range of the photodetector.

In a preferred embodiment, the energy barrier between the radiation-absorbing semiconductor region and the collection semiconductor region is approximately equal to kT, where k is the Boltzmann constant and T is the upper limit of the working temperature range of the photodetector. A typical working temperature range of the photodetector is −30° C. to 50° C., however other working temperatures are envisaged and the same principles can be applied.

In one embodiment, the energy barrier between the radiation-absorbing semiconductor region and the collection semiconductor region has a minimum value of 5 meV, preferably 10 meV, more preferably 15 meV and most preferably 20 meV.

In one embodiment, the energy barrier between the radiation-absorbing semiconductor region and the collection semiconductor region has a maximum value of 100 meV, preferably 75 meV, more preferably 50 meV and most preferably 40 meV.

In a preferred embodiment, the radiation-absorbing semiconductor region is an n-type semiconductor and the collection semiconductor region is a p-type semiconductor.

For example, the objectives of the invention could be achieved in a semiconductor structure comprising an n-type light absorbing layer, an un-doped layer with large band gap (barrier) and a p-type layer with a band gap wider than that of the absorbing layer. The valence band of the absorption layer and the valence band of the barrier layer should have a gap which provides an energy barrier for minority carriers to move from the absorbing layer to the p-type layer. The value of the gap is selected to provide the temperature compensation of the changes of the responsivity of the photodetector to temperature changes in the required temperature range.

In such a preferred embodiment, at least in the absence of an applied bias voltage, the valence band energy of the barrier semiconductor region is lower than the valence band energy of the n-type radiation-absorbing semiconductor region, whereby the energy barrier is a valence band energy barrier which resists the flow of holes from the n-type radiation-absorbing semiconductor region to the p-type collection semiconductor region.

In a further embodiment, the radiation-absorbing semiconductor region is a p-type semiconductor and the collection semiconductor region is an n-type semiconductor.

In another embodiment, the radiation-absorbing semiconductor region is an n-type semiconductor and the collection region is also an n-type semiconductor.

In yet another embodiment, the radiation-absorbing semiconductor region is p-type semiconductor and the collection region is also a p-type semiconductor.

Preferably, the barrier region of semiconductor comprises an intrinsic or very lightly doped semiconductor.

Preferably, in the absence of an applied bias voltage, the Fermi level of the radiation-absorbing semiconductor region in isolation is substantially equal to the Fermi level of the collection semiconductor region in isolation. This advantageously means that it is possible to eliminate the space-charge (depletion) region between the radiation-absorbing and collection regions. This is desirable as it is known that this region creates noise due to Shockley-Read-Hall recombination.

Preferably, the band gap of the barrier semiconductor region additionally forms an energy barrier between the radiation-absorbing semiconductor region and the collection semiconductor region which resists the flow of majority carriers from the radiation-absorbing semiconductor to the collection semiconductor region. This is optional since the relative energy levels of the radiation-absorbing and collection regions may themselves present an energy barrier to majority carrier flow (as is typically the case in a p-i-n configuration). Preferably the majority carrier barrier is sufficient to block the flow of majority carriers from the radiation-absorbing semiconductor to the collection region.

Advantageously, the energy barrier resisting the flow of majority carriers is greater than the energy barrier resisting the flow of minority carriers from the radiation-absorbing semiconductor region to the collection semiconductor region. That is, the magnitude of the majority carrier barrier is greater, in terms of its energy, than that of the minority carrier barrier. For example, where the minority carrier barrier has an energy of around kT, the majority carrier barrier preferably has a magnitude of at least 5 kT, more preferably at least 10 kT.

In one embodiment, the radiation-absorbing semiconductor region is a n-type semiconductor and the collection semiconductor region is a p-type semiconductor, and the conduction band energy of the barrier semiconductor region is greater than the conduction band energy of the n-type radiation-absorbing semiconductor region so as to form a conduction band energy barrier between the n-type radiation-absorbing semiconductor region and the barrier semiconductor region so as to provide resistance to the flow of electrons from the n-type radiation-absorbing semiconductor region to the p-type collection semiconductor region.

In such an embodiment, the conduction band energy barrier between the n-type radiation-absorbing semiconductor region and the barrier semiconductor region is preferably substantially greater than kT, where k is the Boltzmann constant and T is the upper limit of the working temperature range of the photodetector.

In a further embodiment, the barrier region has a sufficient thickness to prevent the tunnelling of carriers between the radiation-absorbing semiconductor region and the collection semiconductor region.

Preferably, the barrier region has a thickness of at least 20 nm, preferably 50 nm, more preferably 75 nm and most preferably 100 nm.

In embodiment, the barrier region has a maximum thickness of 500 nm, preferably 250 nm, more preferably 150 nm and most preferably 100 nm.

In one embodiment, the radiation-absorbing semiconductor region has a thickness substantially equal to or greater than the absorption length of the radiation being detected.

In yet another embodiment, the radiation-absorbing semiconductor region has a maximum thickness of 150% greater than the absorption length of the radiation being detected, preferably 100%, more preferably 75% and most preferably 50%. For example, the radiation absorption length might typically be one micron and the thickness of the radiation-absorbing semiconductor region two microns.

Preferably, the collection semiconductor region has a larger band gap between the valence band and the conduction band than the radiation-absorbing semiconductor, and in a preferred embodiment the collection semiconductor region has a thickness of at least 50 nm, preferably 100 nm, more preferably 150 nm and most preferably 200 nm. Preferably thickness of the collection region is no more than 500 nm, more preferably no more than 300 nm.

Preferably, the lattice structure of the radiation-absorbing semiconductor matches the lattice structure of the barrier semiconductor region.

Preferably, the lattice structure of the collection semiconductor matches the lattice structure of the barrier semiconductor region.

In one embodiment, the radiation-absorbing semiconductor region comprises InAs.

In one embodiment, the barrier region semiconductor region comprises $AlAs_{0.24}Sb_{0.76}$.

In a further embodiment the collection semiconductor region comprises $Al_{0.8}Ga_{0.2}As_{0.15}Sb_{0.85}$ or $In_{0.2}Ga_{0.8}As_{0.25}Sb_{0.75}$.

In one embodiment of the first aspect of the present invention, the radiation-absorbing semiconductor region is positioned on a substrate. In an embodiment where the radiation-absorbing semiconductor region is an n-doped semiconductor the substrate is preferably an n+ doped material.

In one embodiment of the first aspect of the invention, the photodetector further comprises ohmic contacts on the radiation-absorbing semiconductor region and collection semiconductor region. In an embodiment where the radiation-absorbing semiconductor region is positioned on a substrate, the photodetector further comprises ohmic contacts on the substrate and the collection semiconductor region.

Preferably, the ohmic contacts on the collection semiconductor region are arranged in a grid so as to allow as much incident radiation to fall on the collection region as possible.

In one embodiment the radiation-absorbing semiconductor region is an n-type semiconductor and the collection region is also an n-type semiconductor, and the photodetector is biased by a bias voltage, preferably a reverse bias voltage.

In a further embodiment the radiation-absorbing semiconductor region is a p-type semiconductor and the collection region is also a p-type semiconductor, and the photodetector is biased by a bias voltage, preferably a reverse bias voltage.

In a second aspect of the present invention, there is provided a photodetector comprising: a light-absorbing layer comprising n-doped semiconductor; a barrier layer comprising intrinsic semiconductor; and a collecting layer comprising p-doped semiconductor wherein the n-doped light-absorbing layer and p-doped collecting layer are joined together by means of said barrier layer; wherein said barrier layer exhibits a valence band energy exhibiting a barrier relative to the valence band of said light-absorbing layer being sufficient to resist the flow of thermalized minority carriers from said light-absorbing layer to said collecting layer when the temperature is low and small enough to resist for the flow of thermalized minority carriers from the light-absorbing layer to the collecting layer when the temperature is greater.

In a preferred embodiment of the second aspect of the invention, the Fermi level of the n-type semiconductor in isolation is substantially equal to the Fermi level of the p-type semiconductor in isolation.

Preferably, the n-type semiconductor of light-absorbing layer comprises InAs, the intrinsic semiconductor of barrier layer comprises $AlAs_{0.24}Sb_{0.76}$ and the p-type semiconductor of collecting layer comprises $Al_{0.8}Ga_{0.2}As_{0.15}Sb_{0.85}$.

In a preferred embodiment of the second aspect of the invention, the barrier layer exhibits a thickness and a conduction band energy exhibiting a significant barrier relative to the conduction band of said light-absorbing layer, the barrier being sufficient to prevent tunnelling of the majority carriers from the light-absorbing layer to the collecting layer and to block the flow of thermalized majority carriers from said light-absorbing layer to said collecting layer.

In accordance with a third aspect of the invention, there is provided a gas sensor comprising a photodetector according to the first or second aspect.

Preferably, the gas sensor is a methane sensor.

In accordance with a fourth aspect of the present invention, there is provided a method of fabricating a photodetector comprising a light-absorbing layer and a collecting layer separated by and each in contact with a barrier layer, the method comprising: selecting an n-type semiconductor for use as the light-absorbing layer, the n-type semiconductor having a first Fermi level; selecting a thickness of the n-type light-absorbing layer; selecting a semiconductor for use as the barrier layer; selecting a thickness of the barrier layer; selecting a p-type semiconductor for use as the collecting layer, the p-type semiconductor having a second Fermi level; selecting a thickness of p-type collecting layer; joining the n-type semiconductor and then the p-type semiconductor to the barrier layer so as to create the photodetector structure; and wherein the n-type semiconductor and the barrier layer semiconductor are chosen such that, in the absence of an applied bias voltage, the valence band energy of the barrier layer is lower than the valence band energy of the n-type semiconductor layer so as to form a valence band energy barrier between the n-type semiconductor layer and the barrier layer, thereby resisting the flow of minority carriers from the n-type semiconductor layer to the p-type semiconductor layer.

Preferably, the semiconductor for use as the barrier layer comprises an intrinsic semiconductor.

In a preferred embodiment, the second Fermi level is substantially equal to the first Fermi level. This advantageously reduces noise due to the absence of a space-charge (depletion) region between the n-type and p-type semiconductors.

Preferably, the difference between the valence band energy of the n-type light absorbing layer and the valence band of the barrier layer is selected based on the working temperature range of the photodetector.

DETAILED DESCRIPTION OF PREFERRED EMBODIMENTS

Photodetectors based on p-i-n hetero-structures are well known and have significant advantages over conventional photodiodes with p-n junctions. One major advantage is the reduction of the dark current due to the presence of the intrinsic intermediate layer (i), which prevents transition of majority carriers (electrons) from the n-type light-absorbing layer to the p-type collecting area. Reduced dark current allows improved signal-to-noise ratio and sensitivity to low light signals.

Another advantage of including an intermediate layer in infra-red detector structures is that it acts as a barrier to "leakage current". "Leakage current" in this context is an additional source of dark current and refers to extra carrier movement due to the presence of intermediate energy levels ("surface states") present in the band gap as a result of crystal defects arising from cutting wafers of semiconductor material. A wide band gap intermediate layer interrupts this leakage current.

Figure 1:
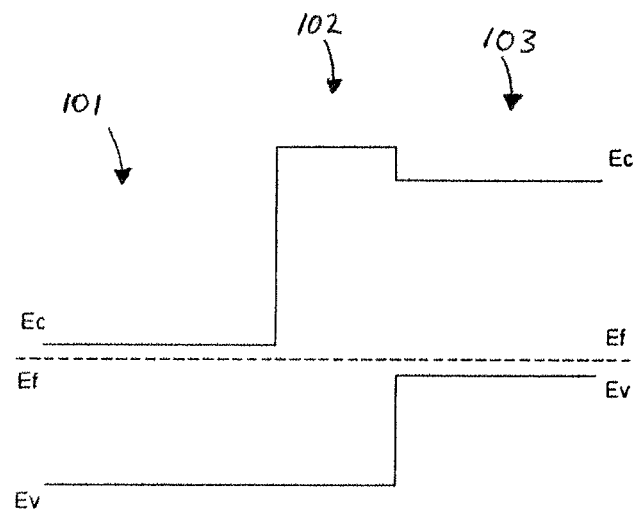
FIG. 1 is an energy band profile of a photodetector based on a p-i-n semiconductor structure according to a comparative example.

FIG. 1 shows the structure of a p-i-n photodetector according to a comparative example, with an n-type semiconductor layer 101, an intrinsic barrier layer 102 and a p-type semiconductor layer 103. Each layer is shown with its conduction band Ec, Fermi level Ef and valence band Ev. If the Fermi levels of the n-type 101 and p-type 103 materials are aligned in such a way that the Fermi level of the n-type semiconductor 101 in isolation is equal to the Fermi level of the p-type semiconductor 103 in isolation (which is preferred but not essential), then it is possible to eliminate the region of space charge between the n-type and p-type layers. Elimination of the space charge region provides an additional advantage because it has been well known that this region creates specific noise according to the Shockley-Read-Hall mechanism.

As one can see, in the p-i-n photodetector of FIG. 1, the intrinsic layer 102 is selected in such a way that there is no energy gap between valence bands of the intrinsic layer 102 and the n-type layer 101. This means that there is no impedance to the movement of the minority carriers from light-absorption n-type area 101 to the collector p-type area 103 and therefore achieves maximum responsivity to the light exposition.

However, a major issue of conventional IR photodetectors based on narrow band gap semiconductors, including p-i-n structures, is the temperature dependence of the dark current. At room temperatures the dark current due to thermal band-to-band carrier generation is far larger than that due to background emission. That is why in the background limited infrared photodetection (BLIP) regime, semiconductor IR photodetectors need to be cooled to low temperatures up to cryogenic. Even if the BLIP regime is not required, when such a photodetector has to work in a relatively wide temperature range (for example, industrial range from −30° C. to +50° C.) the temperature dependence of the photodetector responsivity becomes a critical issue.

This is due to the carrier lifetime—as the temperature decreases, the lifetime of photo-generated carriers increases due to a smaller recombination rate (particularly in terms of non-radiative recombination mechanisms, such as the interaction of carriers with phonons, which depend very strongly on temperature), and the responsivity of the photodetector therefore increases rapidly. As the temperature increases, the recombination rate increases, and the carrier lifetime decreases thereby reducing responsivity. In the range from −30° C. to 50° C. the changes in responsivity could exceed 20 times. In this case high accuracy measurements with IR photodetectors become practically impossible even if they are not limited by intensity of light. Therefore, almost all of the industrial devices which use semiconductor IR photodetectors have a thermostat for the detector. In the field of low power low cost devices (optical gas sensors, for example) the use of a thermostat is unacceptable, so the reduction of the mentioned temperature dependence is very important for the practical applications.

The largest contribution to the dark current in the industrial range of temperatures for photodetector structures such as those shown in FIG. 1 is due to generation processes. There are three major processes: the Shockley-Read-Hall generation-recombination process, the Auger process, and radiative recombination. The temperature dependencies of each of these processes can be described as:

$$G_{SRH} \sim T^2 * \{\exp(-Eg/2kT)\}$$

$$G_{Auger} \sim T^3 * \{\exp(-Eg/kT)\}$$

$$G_{rr} \sim T^{3/2} * \{\exp(-Eg/2kT)\}$$

where T is temperature, Eg is the bandgap energy of the semiconductor material, and k is the Boltzmann constant.

Calculations as well as direct measurements show that over the temperature range from −30° C. to 50° C., the dark current could change by 15-35 times.

Figure 2:
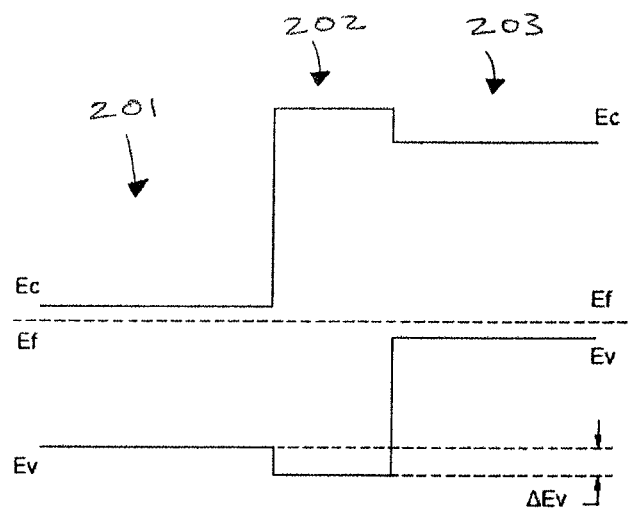
FIG. 2 is an energy band profile of a photodetector structure according to an embodiment of the present invention.

According to an embodiment of the present invention, introducing an additional potential barrier ΔEv in the valence band between the n-type light-absorbing layer 201 and the intermediate intrinsic layer 202 as shown on FIG. 2, compensates, at least partially, for changes in photodetector responsivity with temperature. Potential barrier ΔEv at least partially blocks minority carrier (holes) flow from the n-type layer 201 to the p-type layer 202 when the temperature is low (where photodetector responsivity is increased due to increased carrier lifetime), because only a relatively small number of carriers have sufficient energy to cross the barrier, and does not significantly affect the flow when temperature is high (where photodetector responsivity is decreased due to reduced carrier lifetime), since many more carriers have sufficient energy to cross the barrier. The value of the barrier ΔEv is determined according to the range of the temperature where compensation is to be achieved and the degree of change of the dark current of the initial structure. If for example the required temperature range is from −30° C. to 50° C. for the mentioned p-i-n the barrier, ΔEv, should preferably be about 40 meV.

In use, the illuminated light passes through the p- and i-regions 203, 202 to the n-type light-absorbing layer 201 and is absorbed by the semiconductor. Here, the absorption generates non-equilibrium minority carriers (holes in the valence band in this case) in the n-type layer. The non-equilibrium carriers diffuse to the p-type collecting region 203 and then to a contact (such as item 405 in FIG. 4) and generate the photocurrent. The top of the valence band of the p-type layer 203 is higher than the top of that of the n-type layer 201 so the "collection" of the photo-exited carriers will be very effective. In fact in the region of the intrinsic layer 202 there is a significant valence band gap between the n-type area and the p-type area, which means that in this area there is a strong electric field which forces the carriers to move from n-type area to the p-type area. In this example, the light absorption length of the material is about 1 micron, the diffusion length of the carriers is about 5-7 microns and the thickness of the n-type layer is about 2 microns, so the photo-exited carriers will effectively collect on the border between n- and p-areas and contribute to the photocurrent. This regime does not require any bias voltage (the so-called "photovoltaic" regime).

It should be noted that, whilst in the FIG. 2 example, the barrier layer additionally provides an energy barrier to the flow of majority carriers (electrons) from the n-type layer 201 to the p-type layer 202, in the case of a p-i-n junction, this is not essential and the conduction band energy of the barrier layer could take a lower value. This is because the higher conduction band energy of the p-type layer itself constitutes a barrier to electron flow. However, in other implementations such as a n-i-n junction, this may not be the case and in which case it is preferable that the barrier layer also resists majority carrier flow from the light-absorbing layer to the collecting layer.

An exemplary method of fabrication of a photodetector with reduced temperature dependence will be demonstrated by the design of a p-i-n photodetector for a methane sensor.

In this example, the working wavelength of the sensor is 3.3 microns, which is working in the temperature range from −30° C. to 50° C. The first step is the selection of the material for the light-absorbing layer. We chose the n-type InAs, which has a cut-off wavelength of 3.65 microns for the temperature −30° C., and wavelength 4 microns for 50° C. The next step is to choose the material for the barrier layer. It preferably has to meet three criteria: 1. The material has to have a large conduction band energy discontinuity with respect to InAs—much larger than kT for the lowest working temperature—and which blocks the flow of the majority carriers (electrons) in the entire temperature range; 2. the material has to have a small valence band discontinuity of about 40 meV which is comparable with kT for the highest working temperature; and 3. the lattice of the barrier layer preferably has to match the lattice of the light-absorbing layer. For our case an un-doped triple compound such as $AlAs_{0.24}Sb_{0.76}$ meets all three criteria.

The final step is to choose a material for the p-type layer. Important preferred criteria are: 1. the lattice of the p-type layer should match the lattice of the barrier layer; 2. it is preferable if the p-type layer has a Fermi level equal to the Fermi level of the n-type material (in this example InAs); and 3. it is preferable if the p-type layer has a wider band gap than the n-type layer to minimize light absorbance and reflectivity of the p-type layer. A quaternary compound such as $Al_{0.8}Ga_{0.2}As_{0.15}Sb_{0.85}$ or $In_{0.2}Ga_{0.8}As_{0.25}Sb_{0.75}$ meets all criteria.

Figure 3:
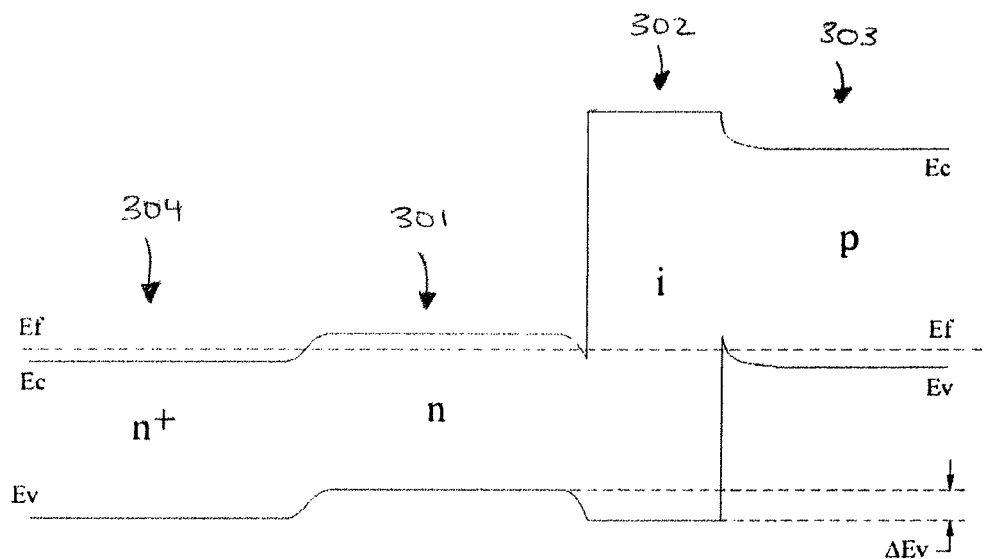
FIG. 3 is an energy band profile of a photodetector according to an embodiment of the present invention.

FIG. 3 shows the final schematic photodetector structure according to an embodiment of the invention. The n-type layer is shown at 301, the barrier layer is shown at 302 and the p-type layer is shown at 303. Also shown in FIG. 3 is an n+ doped substrate layer 304 in contact with the n-type layer.

The thicknesses of layers can be determined from the following preferred conditions:
1. The thickness of the n-type (for example InAs) light-absorbing layer should be about or slightly more (30-50%) than the light absorption length. For a 3.3 micron wavelength it is about 2 microns.
2. The barrier layer should be as thin as possible, but thick enough to prevent tunneling of the carriers between the n-type and p-type layers. In this example, it is about 100 nm thick.
3. The thickness of the p-type layer is not as critical and could be determined as 200 nm or more, but should not be too thick to keep low conductivity of the layer.

Figure 4:
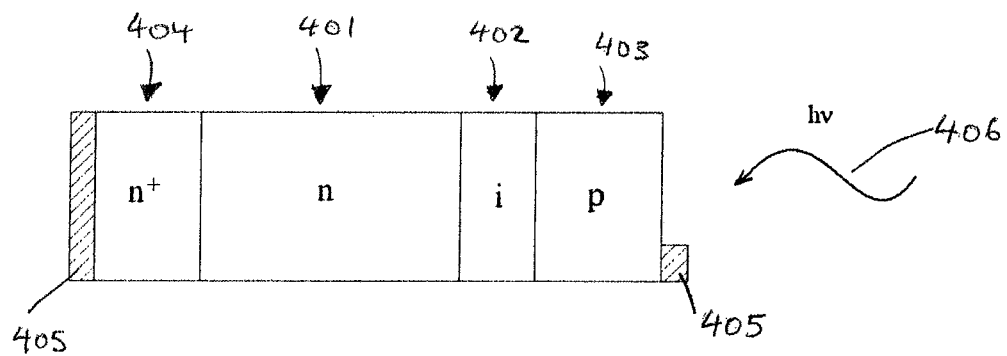
FIG. 4 is a schematic view of the layers of a photodetector according to an embodiment of the invention.

FIG. 4 illustrates schematically the sequence of the layers. The n-type layer is shown at 401, the barrier layer at 402 and the p-type layer at 403. Similarly to FIG. 3, an n+ doped substrate layer is shown at 404 in contact with the n-type layer 401. Ohmic contacts 405 are shown in contact with the n+ type 404 and p-type 403 layers. The Ohmic contacts 405 are generally metallic. An incident photon with energy hv is shown at 406.

In the above description, a "p-i-n" device has been discussed. Typically, such a device will be grown on a substrate with the n-doped radiation-absorbing semiconductor layer deposited first, then the intrinsic layer and finally the p-doped layer, in order to create a wafer. This is the technologically the easiest order in which to create such a "p-i-n" wafer. However, of course it is also possible to deposit a p-doped region first as the radiation-absorbing layer, and use an n-doped semiconductor for the collection region (an "n-i-p" structure). Where this is the case the minority carriers flowing from the radiation-absorbing semiconductor region (p-type) to the collector semiconductor region (n-type) are electrons and the energy barrier between the radiation-absorbing semiconductor region and the collection semiconductor region which resists the flow of minority carriers from the radiation-absorbing semiconductor region to the collection semiconductor region will be therefore in the conduction band. That is, the conduction band energy of the barrier region will be higher than that of the p-type region by the desired magnitude ΔEv, whilst any barrier in the valence band of the barrier layer will be optional.

Both "p-i-n" and "n-i-p" structures work in the so-called photovoltaic regime without the need for a bias voltage to be applied. However, such a device could of course be used under a bias voltage.

In a further embodiment, both the radiation-absorbing layer and the collection layer could comprise the same type of semiconductor (i.e. a "p-i-p" or "n-i-n" device). Such devices act as photoconductors and require a bias voltage, preferably a reverse bias.

The invention claimed is:

1. A photodetector comprising:
a radiation-absorbing semiconductor region and a collection semiconductor region separated by and each in contact with a barrier semiconductor region;
wherein, at least in the absence of an applied bias voltage, the band gap between the valence band energy and the conduction band energy of the barrier semiconductor region is offset from the band gap between the valence band energy and the conduction band energy of the radiation-absorbing semiconductor region so as to form an energy barrier between the radiation-absorbing semiconductor region and the collection semiconductor region which resists the flow of minority carriers from the radiation-absorbing semiconductor region to the collection semiconductor region, and wherein the energy barrier between the radiation-absorbing semiconductor region and the collection semiconductor region has a value of 100meV or less.

2. The photodetector of claim 1, wherein the magnitude of the energy barrier between the radiation-absorbing semiconductor region and the collection semiconductor region is dependent on the working temperature range of the photodetector.

3. The photodetector of claim 1, wherein the energy barrier between the radiation-absorbing semiconductor region and the collection semiconductor region is approximately equal to kT, where k is the Boltzmann constant and T is the upper limit of the working temperature range of the photodetector.

4. The photodetector of claim 1, wherein the energy barrier between the radiation-absorbing semiconductor region and the collection semiconductor region has a minimum value of 5meV, preferably 10meV, more preferably 15meV and most preferably 20meV.

5. The photodetector of claim 1, wherein the energy barrier between the radiation-absorbing semiconductor region and the collection semiconductor region has a value of 75meV or less, preferably 50meV or less and more preferably 40meV or less.

6. The photodetector of claim 1, wherein the radiation-absorbing semiconductor region is an n-type semiconductor and the collection semiconductor region is a p-type semiconductor.

7. The photoconductor of claim 6, wherein at least in the absence of an applied bias voltage, the valence band energy of the barrier semiconductor region is lower than the valence band energy of the n-type radiation-absorbing semiconductor region, whereby the energy barrier is a valence band energy barrier which resists the flow of holes from the n-type radiation-absorbing semiconductor region to the p-type collection semiconductor region.

8. The photodetector of claim 1, wherein the radiation-absorbing semiconductor region is a p-type semiconductor and the collection semiconductor region is an n-type semiconductor.

9. The photodetector of claim 1, wherein the radiation-absorbing semiconductor region is an n-type semiconductor and the collection region is also an n-type semiconductor.

10. The photodetector of claim 9, wherein the photodetector is biased by a bias voltage, preferably a reverse bias voltage.

11. The photodetector of claim 1, wherein the radiation-absorbing semiconductor region is a p-type semiconductor and the collection region is also a p-type semiconductor.

12. The photodetector of claim 1, wherein the barrier region of semiconductor comprises an intrinsic or very lightly doped semiconductor.

13. The photodetector of claim 1, wherein in the absence of an applied bias voltage the Fermi level of the radiation-absorbing semiconductor region in isolation is substantially equal to the Fermi level of the collection semiconductor region in isolation.

14. The photodetector of claim 1, wherein the band gap of the barrier semiconductor region additionally forms an energy barrier between the radiation-absorbing semiconductor region and the collection semiconductor region which resists the flow of majority carriers from the radiation-absorbing semiconductor region to the collection semiconductor region.

15. The photodetector of claim 14, wherein the energy barrier resisting the flow of majority carriers is greater than the energy barrier resisting the flow of minority carriers from the radiation-absorbing semiconductor region to the collection semiconductor region.

16. The photodetector of claim 14, wherein the radiation-absorbing semiconductor region is an n-type semiconductor and the collection semiconductor region is a p-type semiconductor, and the conduction band energy of the barrier semiconductor region is greater than the conduction band energy of the n-type radiation-absorbing semiconductor region so as to form a conduction band energy barrier between the n-type radiation-absorbing semiconductor region and the barrier semiconductor region so as to provide resistance to the flow of electrons from the n-type radiation-absorbing semiconductor region to the p-type collection semiconductor region.

17. The photodetector of claim 16, wherein the conduction band energy barrier between the n-type radiation-absorbing semiconductor region and the barrier semiconductor region is substantially greater than kT, where k is the Boltzmann constant and T is the upper limit of the working temperature range of the photodetector.

18. The photodetector of claim 1, wherein the barrier region has a sufficient thickness to prevent the tunnelling of carriers between the radiation-absorbing semiconductor region and the collection semiconductor region.

19. The photodetector of claim 1, wherein the barrier semiconductor region has a thickness of at least 20nm, preferably 50nm, more preferably 75nm and most preferably 100nm.

20. The photodetector of claim 1, wherein the barrier semiconductor region has a maximum thickness of 500nm, preferably 250nm, more preferably 150nm and most preferably 100nm.

21. The photodetector of claim 1, wherein the radiation-absorbing semiconductor region has a thickness approximately equal to or greater than the absorption length of the radiation to be detected.

22. The photodetector of claim 1, wherein the radiation-absorbing semiconductor region has a thickness of at least 5% greater than the absorption length of the radiation being detected, preferably 15%, more preferably 25% and most preferably 30%.

23. The photodetector of claim 1, wherein the radiation-absorbing semiconductor region has a maximum thickness of 150% greater than the absorption length of the radiation being detected, preferably 100%, more preferably 75% and most preferably 50%.

24. The photodetector of claim 1, wherein the collection semiconductor region has a larger band gap between its valence band and its conduction band than that of the radiation-absorbing semiconductor.

25. The photodetector of claim 1, wherein the collection semiconductor region has a thickness of at least 50nm, preferably 100nm, more preferably 150nm and most preferably 200nm.

26. The photodetector of claim 1, wherein the lattice structure of the radiation-absorbing semiconductor matches the lattice structure of the barrier semiconductor region.

27. The photodetector of claim 1, wherein the lattice structure of the collection semiconductor matches the lattice structure of the barrier semiconductor region.

28. The photodetector of claim 1, wherein the radiation-absorbing semiconductor region comprises InAs.

29. The photodetector of claim 1, wherein the barrier semiconductor region comprises $AlAs_{0.24}Sb_{0.76}$.

30. The photodetector of claim 1, wherein the collection semiconductor region comprises $Al_{0.8}Ga_{0.2}As_{0.15}Sb_{0.85}$ or $In_{0.2}Ga_{0.8}As_{0.25}Sb_{0.75}$.

31. The photodetector of claim 1, wherein the radiation-absorbing semiconductor region is positioned on a substrate.

32. The photodetector of claim 31, wherein the substrate comprises an n+doped material.

33. The photodetector of claim 31, further comprising ohmic contacts on the substrate and the collection semiconductor region.

34. The photodetector of claim 1, further comprising ohmic contacts on the radiation-absorbing semiconductor region and collection semiconductor region.

35. A gas sensor comprising a photodetector according to claim 1.

36. A photodetector comprising:
a light-absorbing layer comprising n-doped semiconductor;
a barrier layer comprising intrinsic semiconductor; and
a collecting layer comprising p-doped semiconductor
wherein the n-doped light-absorbing layer and p-doped collecting layer are joined together by means of said barrier layer;
wherein said barrier layer exhibits a valence band energy exhibiting a barrier relative to the valence band of said light-absorbing layer being sufficient to resist the flow of thermalized minority carriers from said light-absorbing layer to said collecting layer when the temperature is low and small enough to resist for the flow of thermalized minority carriers from the light-absorbing layer to the collecting layer when the temperature is greater, wherein the barrier exhibited by the valence band has a value of 100meV or less.

37. The photodetector of claim 36, wherein the Fermi level of the n-type semiconductor in isolation is substantially equal to the Fermi level of the p-type semiconductor in isolation.

38. The photodetector of claim 36, wherein the n-type semiconductor of light-absorbing layer comprises InAs, the intrinsic semiconductor of barrier layer comprises $AlAs_{0.24}Sb_{0.76}$ and the p-type semiconductor of collecting layer comprises $Al_{0.8}Ga_{0.2}As_{0.15}Sb_{0.85}$ or $In_{0.2}Ga_{0.8}As_{0.25}Sb_{0.75}$.

39. The photodetector of claim 36, wherein said barrier layer exhibits a thickness and a conduction band energy exhibiting a significant barrier relative to the conduction band of said light-absorbing layer, the barrier being sufficient to prevent tunnelling of the majority carriers from the light-absorbing layer to the collecting layer and to block the flow of thermalized majority carriers from said light-absorbing layer to said collecting layer.

40. A gas sensor comprising a photodetector according to claim 36.

* * * * *